US008673165B2

(12) United States Patent
Raghunathan et al.

(10) Patent No.: US 8,673,165 B2
(45) Date of Patent: Mar. 18, 2014

(54) SIDEWALL IMAGE TRANSFER PROCESS WITH MULTIPLE CRITICAL DIMENSIONS

(75) Inventors: Sudharshanan Raghunathan, Albany, NY (US); Sivananda Kanakasabapathy, Albany, NY (US); Ryan O. Jung, Albany, NY (US); Allen H Gabor, Hopewell Junction, NY (US); Sean D. Burns, Yorktown Heights, NY (US); Erin Catherine McLellan, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 13/267,198

(22) Filed: Oct. 6, 2011

(65) Prior Publication Data

US 2013/0089984 A1    Apr. 11, 2013

(51) Int. Cl.
*H01L 21/311* (2006.01)

(52) U.S. Cl.
USPC ......... 216/46; 216/47; 438/696; 257/E21.257

(58) Field of Classification Search
None
See application file for complete search history.

(56) References Cited

U.S. PATENT DOCUMENTS

| 4,994,404 | A * | 2/1991 | Sheng et al. | 438/297 |
|---|---|---|---|---|
| 6,808,992 | B1 | 10/2004 | Ko et al. | |
| 6,995,074 | B2 * | 2/2006 | Kim | 438/427 |
| 7,824,975 | B2 | 11/2010 | Joung et al. | |
| 7,829,411 | B2 | 11/2010 | Loo et al. | |
| 7,960,287 | B2 * | 6/2011 | Johnson et al. | 438/703 |
| 2007/0292996 | A1 | 12/2007 | Abadeer et al. | |
| 2008/0254633 | A1 * | 10/2008 | Burns et al. | 438/703 |
| 2009/0093121 | A1 | 4/2009 | Moon | |
| 2010/0009487 | A1 | 1/2010 | Huo et al. | |
| 2010/0013047 | A1 | 1/2010 | Thies et al. | |
| 2010/0197096 | A1 * | 8/2010 | Johnson et al. | 438/268 |
| 2010/0261351 | A1 * | 10/2010 | Culp et al. | 438/694 |
| 2011/0014791 | A1 | 1/2011 | Johnson et al. | |

FOREIGN PATENT DOCUMENTS

JP          07235675 A       9/1995

OTHER PUBLICATIONS

Notification of Transmittal of the International Search Report and the Written Opinion of the International Searching Authority, or the Declaration dated Dec. 26, 2012.

* cited by examiner

*Primary Examiner* — Allan Olsen
(74) *Attorney, Agent, or Firm* — Yuanmin Cai

(57) ABSTRACT

Embodiment of the present invention provides a method of forming a semiconductor device in a sidewall image transfer process with multiple critical dimensions. The method includes forming a multi-level dielectric layer over a plurality of mandrels, the multi-level dielectric layer having a plurality of regions covering the plurality of mandrels, the plurality of regions of the multi-level dielectric layer having different thicknesses; etching the plurality of regions of the multi-level dielectric layer into spacers by applying a directional etching process, the spacers being formed next to sidewalls of the plurality of mandrels and having different widths corresponding to the different thicknesses of the plurality of regions of the multi-level dielectric layer; removing the plurality of mandrels in-between the spacers; and transferring bottom images of the spacers into one or more layers underneath the spacers.

20 Claims, 12 Drawing Sheets

SIDEWALL IMAGE TRANSFER PROCESS WITH MULTIPLE CRITICAL DIMENSIONS

FIELD OF THE INVENTION

The present invention relates to the field of semiconductor device manufacturing. In particular, it relates to an improved sidewall image transfer process that is suitable for forming multiple critical dimensions of semiconductor devices.

BACKGROUND

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques, and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

With continuous scale-down and shrinkage of real estate in a semiconductor wafer available for a single semiconductor device, engineers are daily faced with the challenge of how to meet the market demand for ever increasing device density. For sub-80 nm pitch patterning, one technique is to achieve twice the pattern density through a technique called sidewall image transfer (SIT), which is also known as sidewall spacer image transfer. In a conventional SIT process, a blanket deposition of spacer making material, such as dielectric material, is usually performed after the mandrel litho development and spacers are then made out of the blanket layer of spacer making material through a directional etching process. However, this process generally creates only one type of spacers that have the same width, measured along the surface of the substrate, resulting only one critical dimension of a device pattern to be transferred to the underneath substrate. In reality, multiple critical dimensions of devices are usually more desirable.

SUMMARY

Embodiments of the present invention provide a method of performing sidewall image transfer that creates multiple critical dimensions of a device pattern. More specifically, the method includes forming a multi-level dielectric layer over a plurality of mandrels, the multi-level dielectric layer having a plurality of regions covering the plurality of mandrels, the plurality of regions of the multi-level dielectric layer having different thicknesses; etching the plurality of regions of the multi-level dielectric layer into spacers by applying a directional etching process, the spacers being formed next to sidewalls of the plurality of mandrels and having different widths corresponding to the different thicknesses of the plurality of regions of the multi-level dielectric layer; removing the plurality of mandrels in-between the spacers; and transferring bottom images of the spacers into one or more layers underneath the spacers.

According to one embodiment, forming the multi-level dielectric layer includes forming a substantially conformal dielectric layer over the plurality of mandrels; covering a first portion of the substantially conformal dielectric layer with a mask, which maybe a soft or hard mask; etching rest of the substantially conformal dielectric layer, which is a second portion thereof and is not covered by the soft or hard mask, in an etching process, thereby causing the rest of the substantially conformal dielectric layer to have a thickness that is less than that of the first portion of the substantially conformal dielectric layer; and removing the soft or hard mask.

According to another embodiment, the substantially conformal dielectric layer includes at least a first and a second successively deposited layers of dielectric materials, and wherein etching the second portion of the substantially conformal dielectric layer comprises removing the second layer of dielectric material that is not covered by the soft or hard mask to expose the first layer of dielectric material underneath thereof.

In one embodiment, the dielectric material of the second layer is different from the dielectric material of first layer, and the removing of the second layer of dielectric material is performed through an etching process that is selective to the first layer of dielectric material.

According to another embodiment, the method further includes, after removing the soft or hard mask which is a first mask, forming a second soft or hard mask to cover a third portion of the substantially conformal dielectric layer; etching rest of the substantially conformal dielectric layer, which is a fourth portion thereof and is not covered by the second soft or hard mask, in an isotropic etching process; and removing the second soft or hard mask.

In one aspect, the third portion of the substantially conformal dielectric layer is a portion of the first portion of the substantially conformal dielectric layer that is previously covered by the first soft or hard mask, and wherein the etching of the fourth portion of the substantially conformal dielectric layer creates three different thicknesses in three different regions of the substantially conformal dielectric layer.

In another aspect, the third portion of the substantially conformal dielectric layer is a combination of a section of the first portion and a section of the second portion of the substantially conformal dielectric layer, and wherein the etching of the fourth portion of the substantially conformal dielectric layer creates four different thicknesses in four different regions of the substantially conformal dielectric layer.

According to one embodiment, within each of the plurality of regions of different thicknesses the multi-level dielectric layer is a substantially conformal dielectric layer.

According to another embodiment, transferring bottom images of the spacers includes applying a directional etching process to etch away portions of the one or more layers thereupon the spacers are formed by applying the spacers as a protection mask.

BRIEF DESCRIPTION OF THE DRAWINGS

The invention will be understood and appreciated more fully from the following detailed description of preferred embodiments, taken in conjunction with the accompanying drawings of which.

Figure 1:
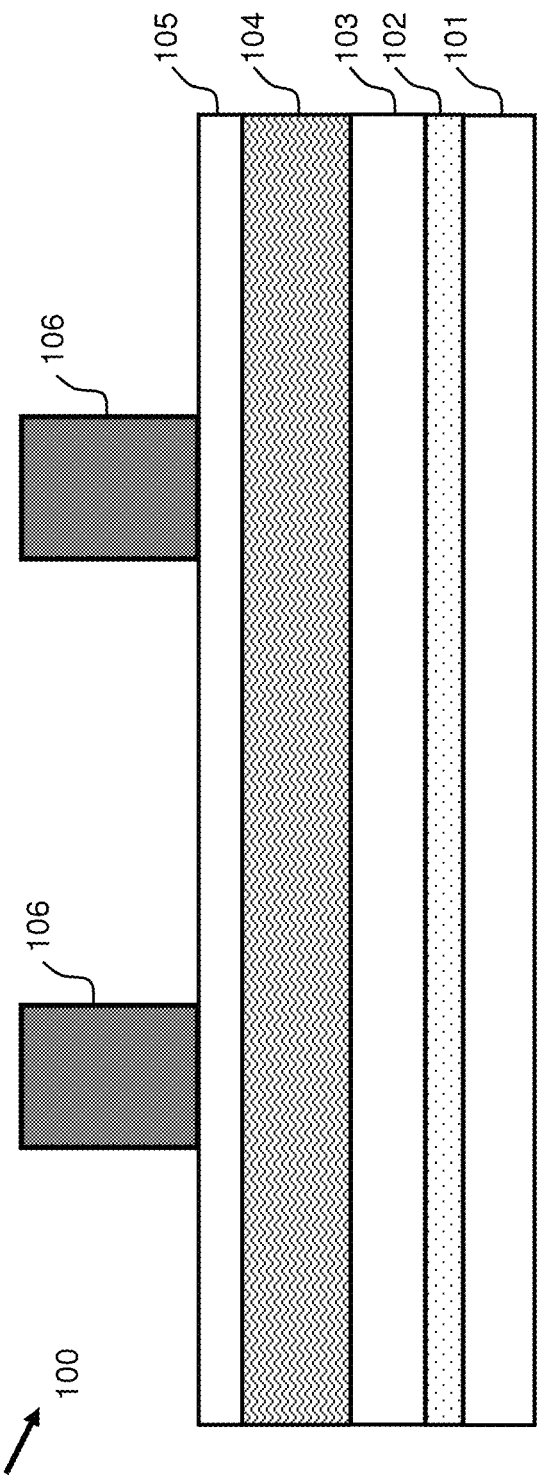
FIGS. 1-6 are demonstrative illustrations of cross-sectional views of a semiconductor structure, with multiple critical dimensions, in a method of forming thereof according to one embodiment of the present invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF PREFERRED EMBODIMENTS

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the present invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the present invention. It is to be understood that the following descriptions have rather focused on distinctive features and/or elements of various embodiments of the invention.

FIGS. 1-6 are demonstrative illustrations of cross-sectional views of a semiconductor structure, with multiple critical dimensions, in a method of forming thereof according to one embodiment of the present invention. In FIGS. 1-6, semiconductor structure 100 may be, as some non-limiting examples, a back-end-of-line (BEOL) interconnect structure, a mid-of-line (MOL) interconnect structure, or in some instances a front-end-of-line (FEOL) device that may include, for example, a high-k metal gate semiconductor transistor device.

For example, FIG. 1 is a demonstrative illustration of a cross-sectional view of semiconductor structure 100, with multiple critical dimensions (CD), in a step of forming thereof according to one embodiment of the present invention. In one embodiment, the method may start with a stack of layers on top of a substrate 101 therein a device pattern with multiple CDs is to be formed. More specifically, the stack of layers may include, for example, a dielectric cap layer 102; a hard mask layer 103; a planarization layer 104; and another hard mask layer 105.

Substrate layer 101 at the bottom of the stack may be a dielectric material suitable for forming BEOL or MOL interconnect structures, or may be a gate material suitable for forming FEOL structures. In some embodiments, substrate layer 101 may be a semiconductor material or a semiconductor on top of a dielectric material like a silicon-on-insulator (SOI) substrate. Dielectric cap layer 102 may include silicon oxide and may be formed, for example, from a tetraethyl orthosilicate (TEOS) precursor. Hard mask layers 103 and 105 may include metal-nitride and/or metal-oxide, and may be formed to have same or different thicknesses. Planarization layer 104 may be an organic planarization layer (OPL) or a layer of material that is capable of providing planarization whereupon hard mask layer 105 may be formed through deposition. For example, when hard mask layer 105 is a titanium-nitride (TiN) layer, planarization layer 104 may be, for example, an amorphous carbon layer that is able to withstand the high temperature of depositing TiN on top thereof without causing degassing and/or decomposition of the material.

The method may further include forming a plurality of mandrels 106 on top of hard mask layer 105. The multiple mandrels 106 may be made from any appropriate material such as, for example, a layer of organic material, including polymer, using a standard photolithographic process.

Here, it is to be noted that the stack of layers 102-105, as being demonstratively depictured in FIG. 1, is one of many possible examples through the use of which semiconductor device or devices of multiple CDs may be formed on top of or inside substrate 101. Other types of combination of dielectric and/or semiconductor layers may be used as well without deviating from the spirit of present invention.

Next, according to one embodiment of the present invention, a multi-level dielectric layer may be formed on top of and covering the plurality of mandrels 106. The multi-level dielectric layer, as is demonstratively illustrated in FIG. 3 as dielectric layer 301, may be formed through various processes, such as through a multiple deposition process or a multiple etching process on an initially deposited dielectric layer which is preferably a substantially conformal layer, to have a plurality of regions of different thicknesses. Within each region as in one embodiment, the multi-level dielectric layer may be made, or remain to be, substantially conformal although embodiments of the present invention are not limited in this aspect. Hereinafter, one of the processes of forming a multi-level dielectric layer on top of the plurality of mandrels 106 is described in more details.

Figure 2:
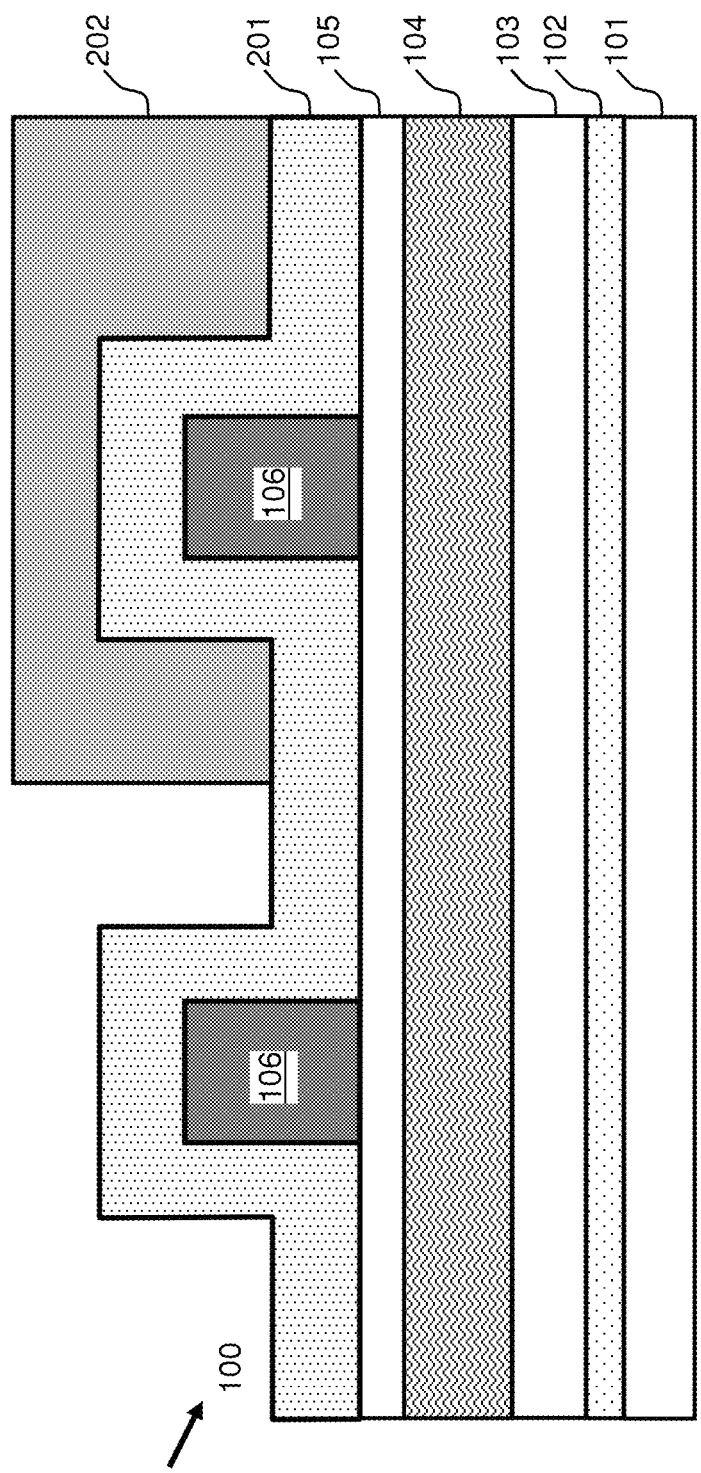

FIG. 2 is a demonstrative illustration of a cross-sectional view of semiconductor structure 100, with multiple CDs, in a step of forming thereof following the step shown in FIG. 1, according to one embodiment of the present invention. More specifically, the method includes depositing a layer of dielectric material 201 directly on top of the multiple mandrels 106. The deposition may be made by a conformal deposition process, such as a high-density plasma (HDP) deposition process or any other known or future developed techniques, to create dielectric layer 201 that is substantially conformal to have a substantially uniform thickness across multiple mandrels 106. In one embodiment, material of dielectric layer 201 may include silicon nitride or low temperature silicon oxide, although other dielectric material may be used as well. In fact, any material that is suitable for forming sidewall spacers with a compatible process may be used.

Following the formation of dielectric layer 201, a mask 202, which may be a soft mask (such as a photo-mask) or a hard mask, may be formed on top of the substantially conformal dielectric layer 201 to selectively cover a first portion of dielectric layer 201. The first portion of dielectric layer 201 is formed on top of a first group of mandrels 106. Mask 202 may be employed, and patterned, to protect dielectric layer 201 underneath thereof from being etched in one or more subsequent etching processes that are designed to form a multi-level dielectric layer 301 which becomes to have multiple different thickness in different regions, as being demonstratively illustrated in FIG. 3.

Figure 3:
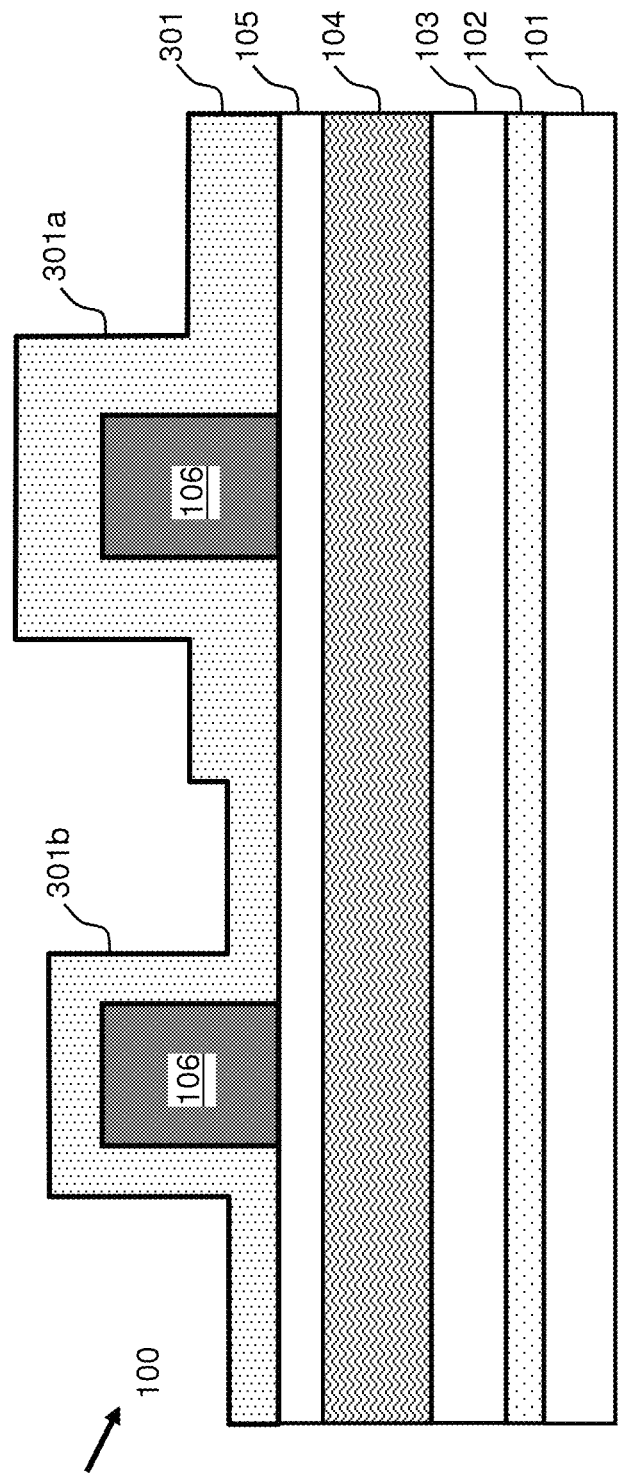

FIG. 3 is a demonstrative illustration of a cross-sectional view of semiconductor structure 100, with multiple CDs, in a step of forming thereof following the step shown in FIG. 2, according to one embodiment of the present invention. More specifically, the method includes reducing the thickness of the rest of dielectric layer 201, which may be referred to as a second portion of dielectric layer 201, which is not covered by soft or hard mask 202. The reduction of thickness may be achieved by applying, for example, a preferably isotropic etching process. The isotropic etching process reduces, substantially uniformly, thickness of the exposed portion of dielectric layer 201 to create multi-level dielectric layer 301 which includes at least a first region 301*a* and a second region 301*b*. In FIG. 3, it is demonstratively illustrated that second region 301*b*, which is substantially conformal, of multi-level dielectric layer 301 has a thickness that is less than that of first region 301*a* of multi-level dielectric layer 301 that was covered and protected by soft or hard mask 202 during the isotropic etching process. The above process transforms substantially conformal dielectric layer 201 into a multi-level dielectric layer 301. After the etching, soft or hard mask 202 may be removed by applying any conventional process.

Here, it is important to note that essence of the present invention is in forming a multi-level dielectric layer that has different thicknesses in different regions, while in the meantime is preferably conformal within each individual region, that cover different mandrels or different groups of mandrels. In order to achieve the above, one embodiment of the method is through the above described selective etching process on an initially uniformly formed dielectric layer. However, embodiments of the present invention are not limited in the above aspect and other different approaches may be employed as well. For example, multi-level dielectric layer 301 having different thicknesses in different regions may be created or formed through, for example, a multiple-deposition process that may perform selective deposition in different areas over different or different groups of mandrels 106. Moreover, other existing or future developed techniques may be used as well to achieve changes in thickness in different regions of multi-level dielectric layer 301.

After the deposition and according to one embodiment, regions 301*a* and 301*b* of dielectric layer 301 may be subjected to a directional etching process such as a reactive-ion-etching (RIE) process to be formed into spacers of different widths. As being demonstratively illustrated in FIG. 4, the directional etching process may remove most of dielectric layer 301, from the top of hard mask layer 105 to leave only a portion of regions 301*a* and 301*b* of dielectric layer 301 at the sidewalls of mandrels 106, forming sidewall spacers 401*a* and 401*b*.

According to embodiment of the present invention, a width of spacers 401, as being measured horizontally at the bottom of spacer 401*a* along hard mask 105, may correspond to the thickness of dielectric layer region 301*a* and may in fact be substantially equal to the thickness of dielectric layer region 301*a* as in FIG. 3. Similarly, a width of spacers 401*b*, as being measured horizontally at the bottom thereof, corresponds to the thickness of dielectric layer region 301*b* and may be substantially equal to the thickness of dielectric layer region 301*b*. In other words, the width of spacers 401*b* may be narrower than the width of spacers 401*a* because of the difference in thickness of their respective regions 301*a* and 301*b* of dielectric layer 301. Different widths of different spacers represent different critical dimensions of a device pattern that is to be transferred into the one or more layers underneath thereof. Therefore, semiconductor devices with multiple CDs may be formed.

Figure 4:
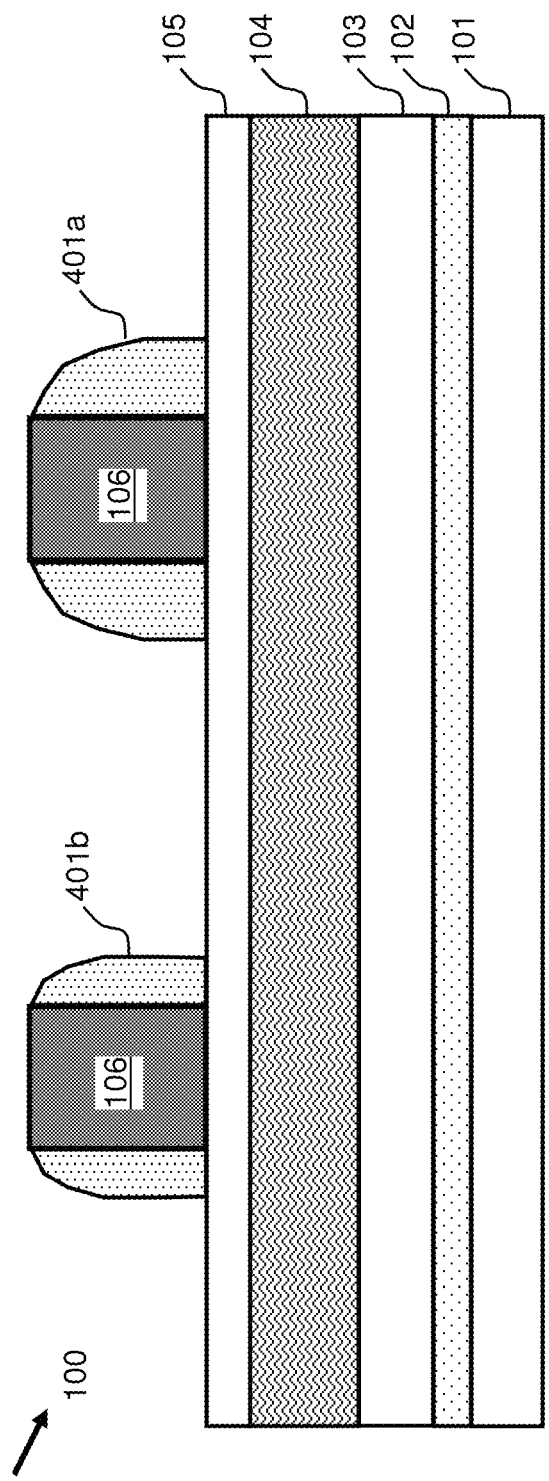
Figure 5:
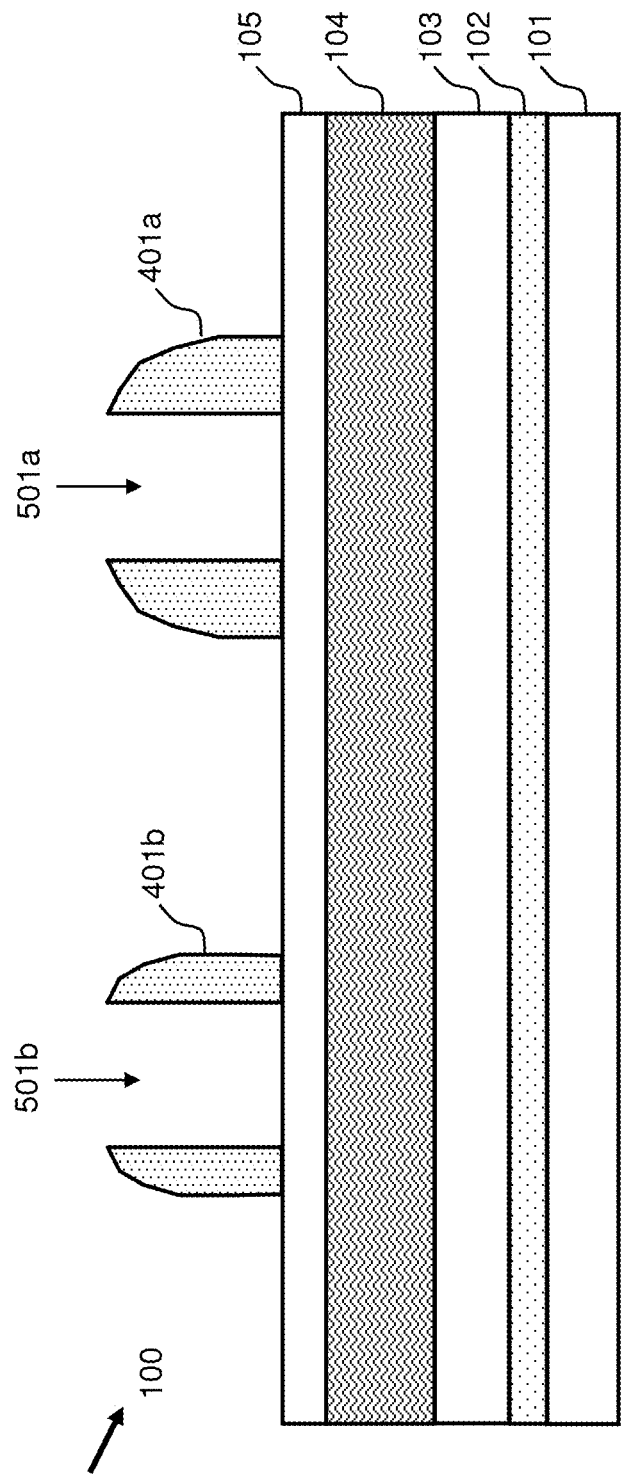

FIG. 5 is a demonstrative illustration of a cross-sectional view of semiconductor structure 100, with multiple CDs, in a step of forming thereof following the step shown in FIG. 4, according to one embodiment of the present invention. After transforming multi-level dielectric layer 301 into a plurality of sidewall spacers 401*a* and 401*b* having different widths, in one embodiment, mandrels 106 may be pulled out to form or create openings 501*a* and 501*b*, and the pulling out may be performed in an oxygen-containing plasma in which the sidewall spacers 401*a* and 401*b* will not be trimmed, or the widths of sidewall spacers 401*a* and 401*b* will not be significantly affected. Effectively, the multiple CDs represented by the widths of spacers 401*a* and 401*b* may be maintained. As being illustrated in FIG. 5, spacers 401*a* and 401*b* have different widths that provide two different critical dimensions for a device pattern to be transferred in subsequent processes. Critical dimensions of more than two may be achieved as well.

Figure 6:
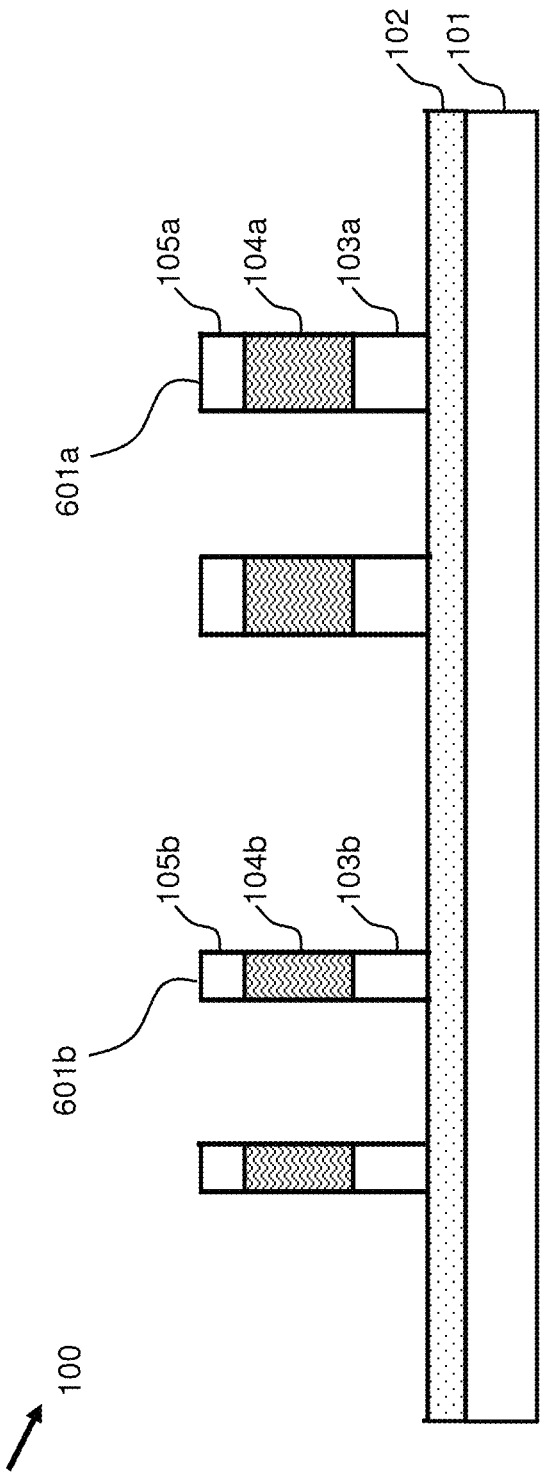

FIG. 6 is a demonstrative illustration of a cross-sectional view of semiconductor structure 100, with multiple CDs, in a step of forming thereof following the step shown in FIG. 5, according to one embodiment of the present invention. More specifically, bottom images of spacers 401*a* and 401*b* may be transferred to underlying layers, including hard mask layer 105, planarization layer 104, and hard mask layer 103, to form stacks of patterned layers. For example, under the spacer 401*a*, a stack 601*a* made of layers 103*a*, 104*a*, and 105*a* may be formed, and under the spacer 401*b*, a stack 601*b* made of layers 103*b*, 104*b*, and 105*b* may be formed. Stack 601*a* and stack 601*b* may possess different critical dimensions for semiconductor device 100. Subsequently, the pattern of bottom images of spacers 401*a* and 401*b* may be transferred, such as through an etching process, to underneath substrate 101 using existing or future developed processes.

Figure 7:
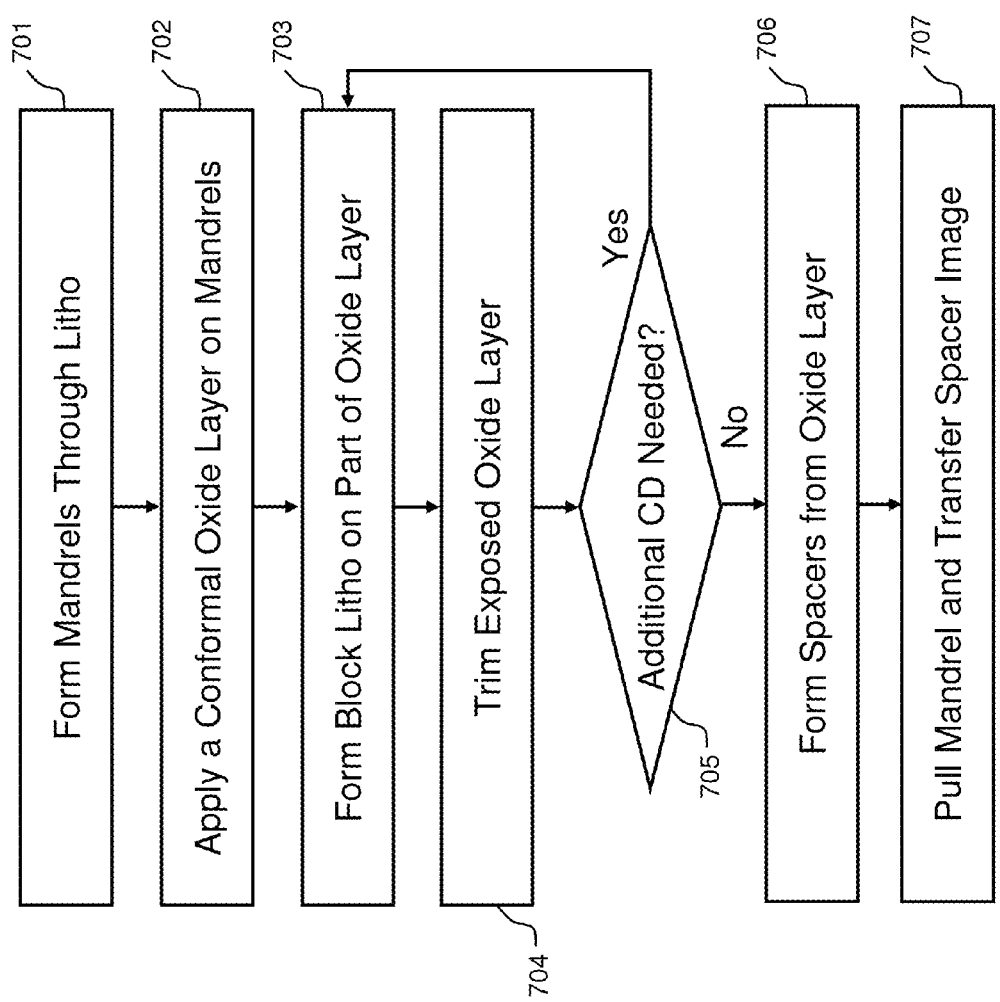
FIG. 7 is a flow-chart illustration of a method of forming semiconductor structures having multiple critical dimensions according to an embodiment of the present invention.

FIG. 7 is a flow-chart illustration of a method of forming semiconductor structures having multiple critical dimensions according to one embodiment of the present invention. More specifically, the method includes forming mandrels on a substrate through a lithographic process at step 701. The substrate may be covered by one or more soft or hard masks and other appropriate layers that are designed for the transfer of a device pattern with multiple critical dimensions into the substrate. The method includes subsequently forming a multi-level dielectric layer on top of the mandrels. In order to form the multi-level dielectric layer, the method includes a step 702 of forming, for example through a high-density plasma deposition, a substantially conformal dielectric layer such as an oxide layer on top of the mandrels. Next on top of the oxide layer, a block lithographic pattern such as a soft or hard mask may be formed to cover at least a part or portion of the oxide layer at step 703. With the part or portion of oxide layer 703 being protected by the soft or hard mask, the method includes a step 704 of trimming thickness of the exposed oxide layer through, for example, an isotropic etching process. The trimming process creates a thickness of the exposed oxide layer, different from the one covered by the soft or hard mask, and this thickness may serve as a different critical dimension in a pattern to be formed in the substrate.

Embodiment of the present invention provides a method of creating device patterns with more than two different critical dimensions. For example, at step 705, the method includes a step of determining whether additional critical dimension (CD) is needed or desired to be created in the substrate. If additional CD is required, the method then goes back to step 703 to form another soft or hard mask pattern, after removing the previously formed soft or hard mask, on the already etched oxide layer. Different sections or regions that are exposed by this new soft or hard mask are then etched again at step 704, creating additional differences in thickness of the oxide layer in different sections or regions. The above process may be repeated until a desired or pre-determined number of differences in thickness of the oxide layer is achieved. This pre-determined number of differences in thickness represents a pre-determined number of critical dimensions of a device or devices to be formed in the underlying substrate.

At step 705, if a pre-determined number of critical dimensions, represented by the difference in thickness of the oxide layer, has been obtained and no more additional CD is needed, then the method moves to a step 706 of forming spacers from the trimmed oxide layer, which is now a multi-level dielectric layer meaning that it has different thicknesses in different regions. In the meantime, in each different region, the oxide layer is still substantially conformal. In forming the spacers through etching, because the difference in thickness and in order to completely or substantially remove the oxide layer that is above the substrate, some regions where the oxide layer is thinner than others may experience some degree of over-etching. However, such over-etching is generally tolerably acceptable. This is particularly true since in some cases the underneath substrate is usually covered by a hard mask such as hard mask 105, as being illustrated in FIG. 5. Following the formation of spacers with different widths or critical dimensions, the method includes a step 707 of removing the mandrels that are exposed by the etching of oxide layer on top thereof, and using existing or future developed techniques to transfer the bottom images of the spacers into the underneath substrate.

Figure 8:
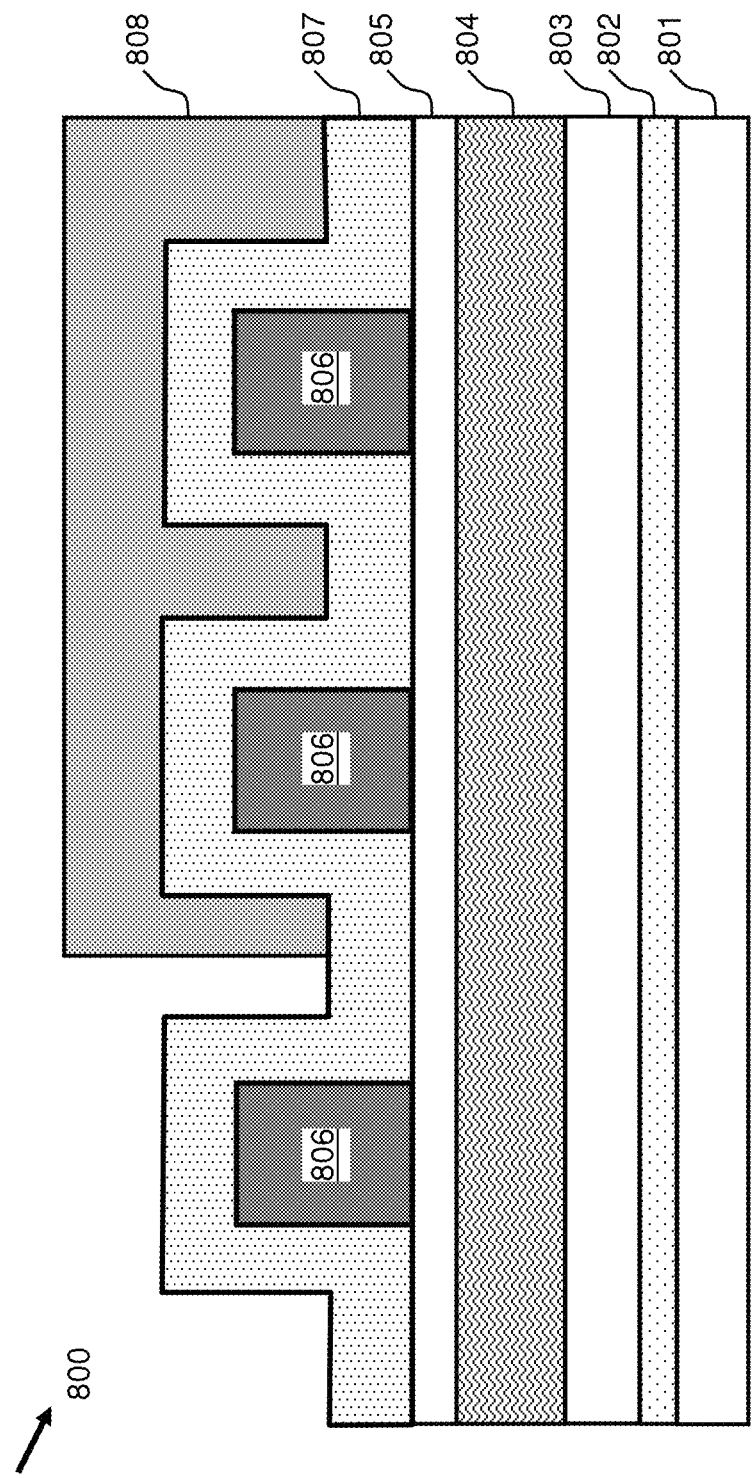
FIGS. 8-10 are demonstrative illustrations of cross-sectional views of a semiconductor structure, with multiple critical dimensions, in a method of forming thereof according to another embodiment of the present invention.
Figure 9:
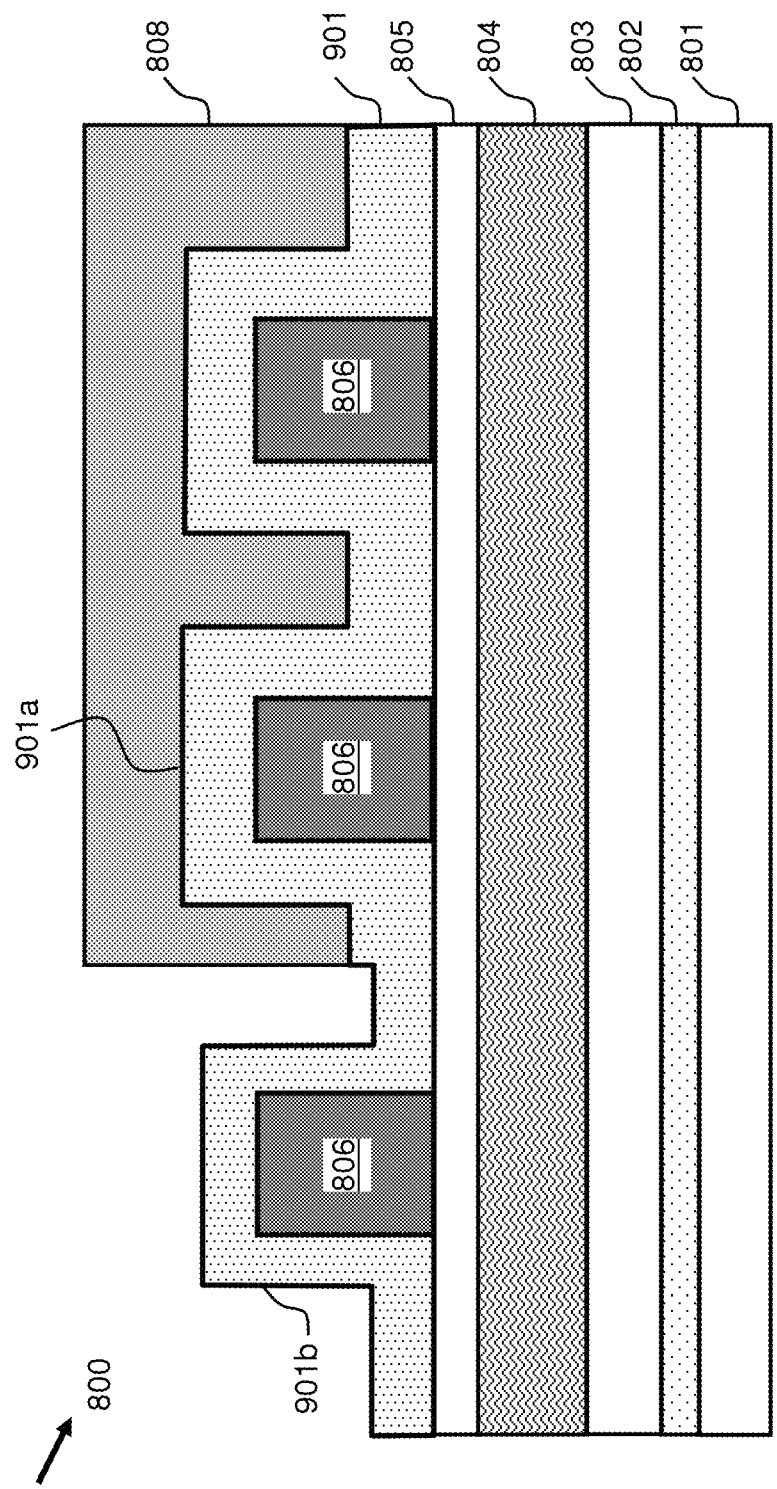
Figure 10:
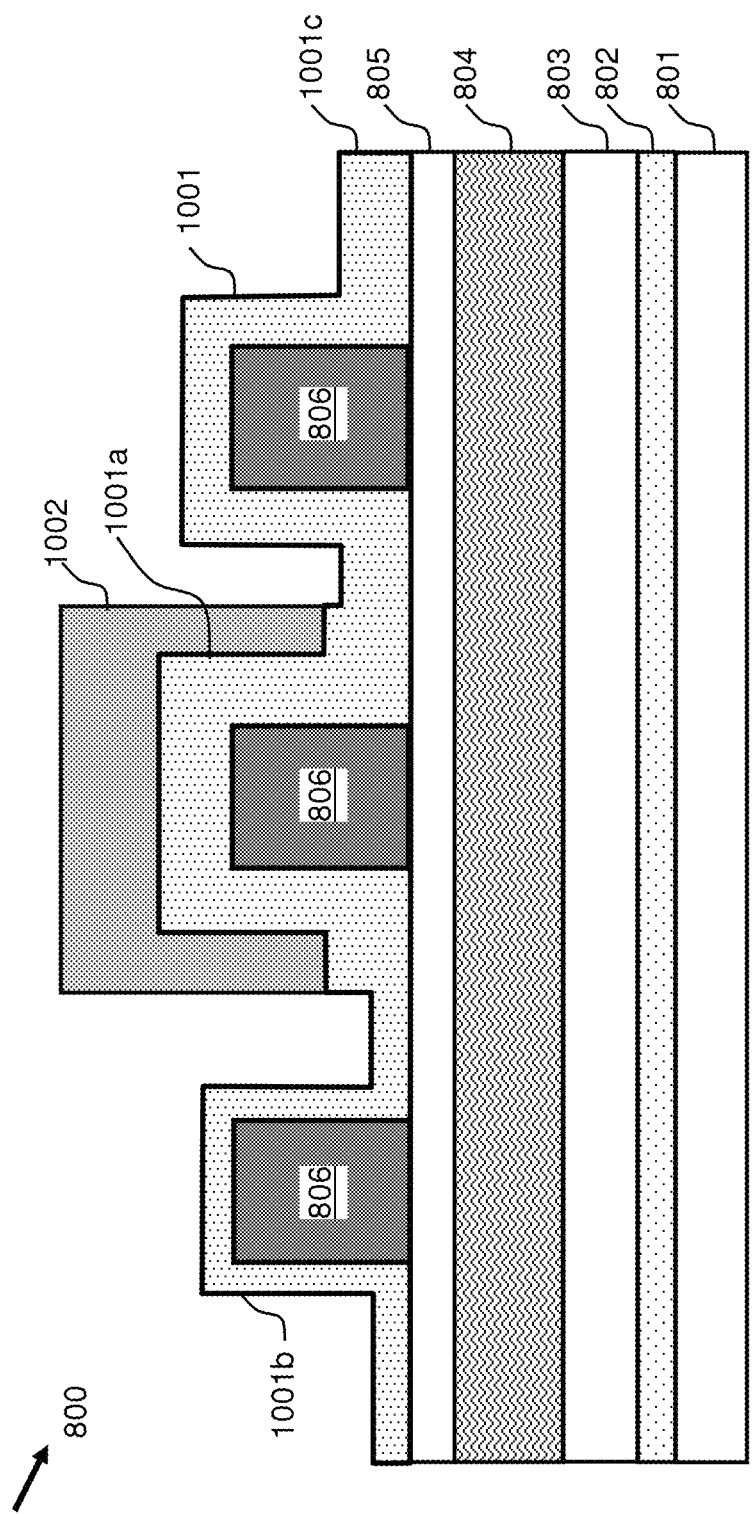

FIGS. 8-10 are demonstrative illustrations of cross-sectional views of a semiconductor structure 800, with multiple CDs, in a method of forming thereof according to embodiments of the present invention. Similar to FIG. 2, FIG. 8 illustrates a mask 808, which may be a soft or hard mask, covering a portion of a dielectric layer 807 underneath thereof, which was formed substantially uniformly to cover multiple mandrels 806. For example, as being demonstratively illustrated in FIG. 8, the portion of dielectric layer 807 on top of the middle and right-side mandrels 806 is covered by mask 808 while the portion of dielectric layer 807 on top of the left-side mandrel 806 is exposed. Mandrels 806 are formed on a stack of layers 802, 803, 804, and 805, which are similar to layers 102, 103, 104, and 105 as in FIG. 2 and are formed on top of a substrate 801.

FIG. 9 is a demonstrative illustration of a cross-sectional view of semiconductor structure 800, with multiple CDs, in a method of forming thereof following the step shown in FIG. 8, according to one embodiment of the present invention. During this step, the exposed portion of dielectric layer 807 is preferably isotropic etched to become a region 901*b* having a reduced thickness, as being compared with the rest region 901*a* that is covered by mask 808. The initially substantially conformal dielectric layer 807 now becomes a two-level dielectric layer 901. After the etching, mask 808 may be removed.

FIG. 10 is a demonstrative illustration of a cross-sectional view of semiconductor structure 800, with multiple CDs, in a method of forming thereof following the step shown in FIG. 9, according to one embodiment of the present invention. During this step, a new soft or hard mask may be formed to cover a different portion of dielectric layer 901. For example, as being illustrated in FIG. 10, soft or hard mask 1002 may be formed to cover only the center portion of dielectric layer 901 that is on top of the middle mandrel 806. With both the left and right portions of dielectric layer 901 being exposed, an isotropic etching process may be applied which further trims the thickness of region 901*b* to become a new region 1001*b* which have an even thinner thickness than region 901*b*. In the meantime, the isotropic etching process creates a region 1001*c* that has a thickness that is thicker than region 1001*b* but thinner than a region 1001*a*, which is the region covered by soft or hard mask 1002 of original thickness of dielectric layer 807.

By performing multiple isotropic etching processes with different soft or hard masks, the above process creates a dielectric layer 1001, which includes regions 1001*a*, 1001*b*, and 1001*c*, that is a multi-level dielectric layer such as a 3-level dielectric layer as in FIG. 10. Following the formation of dielectric layer 1001, according to embodiment of the present invention, a directional etching process may be applied to transform dielectric layer 1001 into spacers with different widths representing or corresponding to multiple critical dimensions for a semiconductor device.

Figure 11:
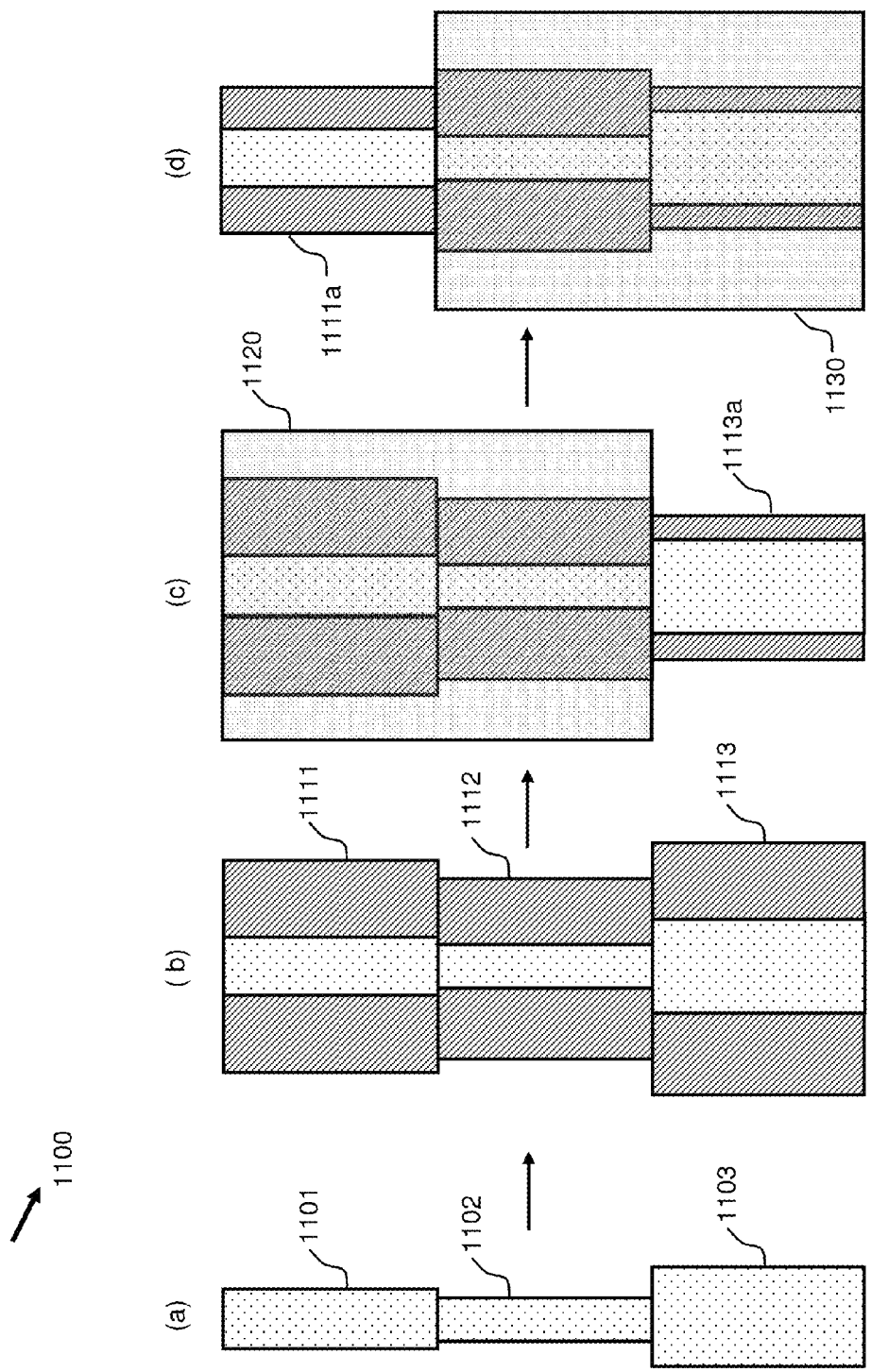
FIGS. 11(a), (b), (c), and (d) are demonstrative illustrations of top views of a semiconductor structure, with multiple critical dimensions, in a method of forming thereof according to yet another embodiment of the present invention.

FIGS. 11(*a*), (*b*), (*c*), and (*d*) are demonstrative illustrations of top views of semiconductor structure 1100, with multiple CDs, in a method of forming thereof according to embodiments of the present invention. More specifically, in a step of forming semiconductor structure 1100, three mandrels 1101, 1102, and 1103 of different widths, for example, may be formed and arranged in a pattern as is shown in FIG. 11(*a*). Next, a dielectric layer of material may be deposited to cover mandrels 1101, 1102, and 1103. In FIG. 11(*b*), in order to illustrate the relative positions, mandrels 1101, 1102, and 1103 are shown to be visible although in reality all mandrels are covered by the dielectric layer. In addition, dielectric layer adjacent to mandrel 1101 is shown as dielectric layer 1111; dielectric layer adjacent to mandrel 1102 is shown as dielectric layer 1112; and dielectric layer adjacent to mandrel 1103 is shown as dielectric layer 1113 for the simplicity of description purpose although they are all part of a single dielectric layer. Following the formation of dielectric layers 1111, 1112, and 1113, a soft or hard mask 1120 may be formed to cover dielectric layers 1111 and 1112, and the mandrels underneath thereof, as is shown in FIG. 11(*c*), and only dielectric layer 1113 is exposed. Dielectric layer 1113 may then be subjected to an isotropic etching process to have a thickness trimmed down to that of dielectric layer 1113*a*.

Following the trimming of dielectric layer 1113 which is formed covering mandrel 1103, a second soft or hard mask 1130 may be formed that covers dielectric layer 1112 and thickness trimmed dielectric layer 1113*a* leaving dielectric layer 1111 being exposed. Thickness of dielectric layer 1111 is then trimmed, similar to the trimming of dielectric layer 1113, to have a thickness 1111*a* which may in general be different from either thickness of dielectric layer 1113*a* or thickness of dielectric layer 1112, as is shown in FIG. 11(*d*).

By this stage, the originally deposited dielectric layer, as is shown in FIGS. 11(*b*) as 1111, 1112 and 1113, possesses three different thicknesses in three different sections covering mandrels 1101, 1102, and 1103, respectively. According to one embodiment, the dielectric layer may be etched in a directional etching process to form spacers next to mandrels 1101, 1102, and 1103 having different widths. The different widths of spacers represent different critical dimensions of semiconductor device patterns to be transferred to a substrate underneath the spacers.

Figure 12:
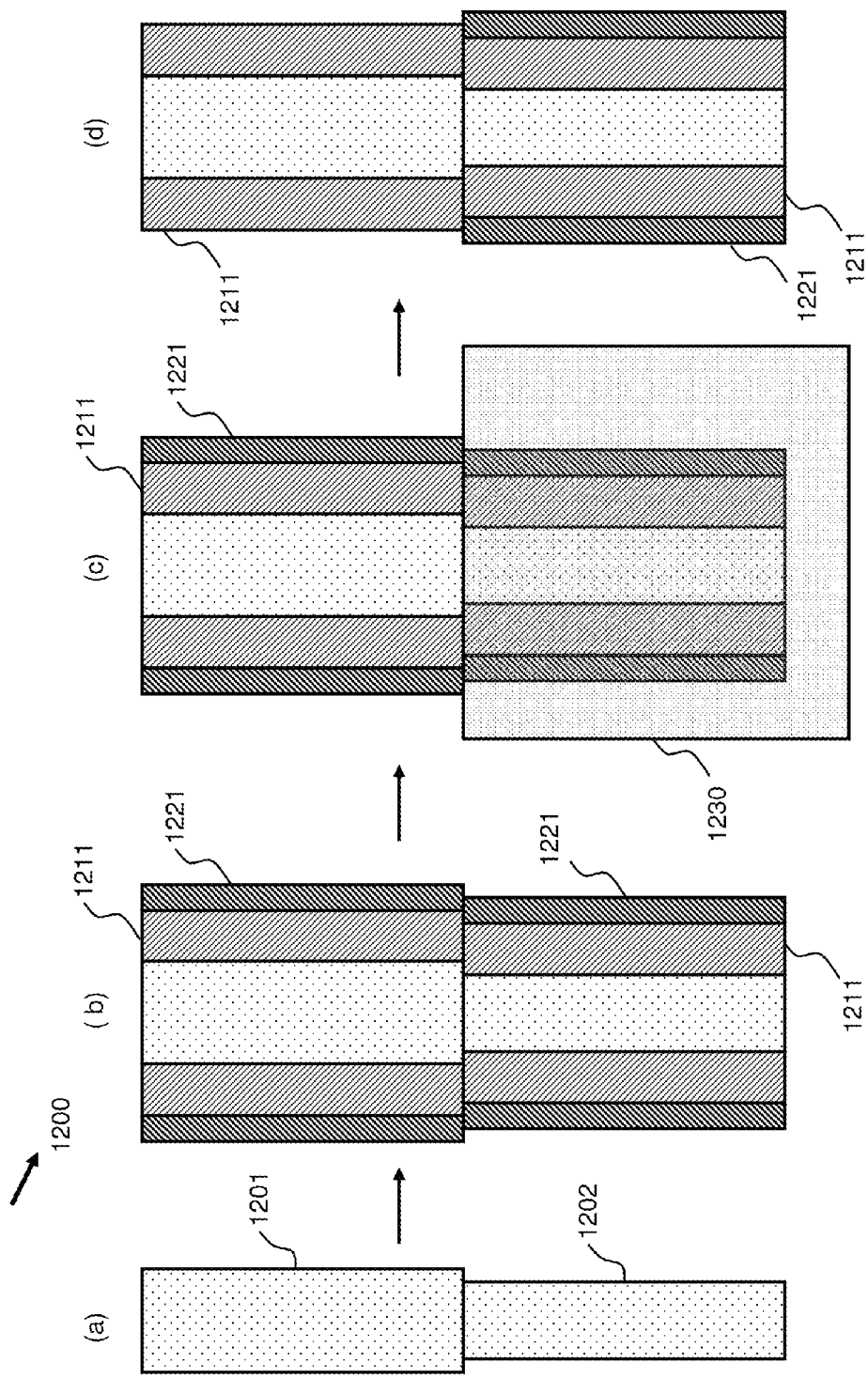
FIGS. 12(a), (b), (c), and (d) are demonstrative illustrations of top views of a semiconductor structure, with multiple critical dimensions, in a method of forming thereof according to one embodiments of the present invention.

FIGS. 12(a), (b), (c), and (d) are demonstrative illustrations of a top view of semiconductor structure 1200, with multiple CDs, in a method of forming thereof according to embodiments of the present invention. More specifically, in forming semiconductor structure 1200, for example, two mandrels 1201 and 1202 may be formed on a substrate as is shown in FIG. 12(a). Mandrels 1201 and 1202 are shown to have different widths for the purpose of illustration and mandrels 1201 and 1202 may actually have the same widths. According to one embodiment, mandrels 1201 and 1202 may subsequently be covered by a first conformal dielectric layer 1211 and a second conformal dielectric layer 1221 through two successive dielectric deposition processes. First conformal layer 1211 and second conformal layer 1221 may preferably be different dielectric material. In FIG. 12(b), although being covered by second conformal layer 1221, for description purpose, both mandrels 1201, 1202 and first conformal layer 1211 are illustratively shown.

Following the formation of conformal dielectric layers 1211 and 1221, according to one embodiment of the present invention as is shown in FIG. 12(c), a portion of conformal dielectric layer 1221 on top of mandrel 1202 may be covered by a soft or hard mask 1230, which exposes the rest of conformal dielectric layer 1221 that is on top of mandrel 1201. The exposed portion of conformal dielectric layer 1221 may subsequently be removed or etched away, by applying an etching process which is preferably selective to conformal dielectric layer 1211, to expose the underneath dielectric layer 1211. As is shown in FIG. 12(d), after removing soft or hard mask 1230, mandrel 1201 is now only covered by dielectric layer 1211 while mandrel 1202 is covered by both dielectric layer 1211 and dielectric layer 1221, resulting in different total thickness of the dielectric layer(s). According to embodiment of the present invention, a subsequent directional etching process may transform the conformal dielectric layer(s) into spacers next to sidewalls of mandrels 1201 and 1202. The spacers, with different number of dielectric layers, have different widths which represent different critical dimensions that are required for forming device patterns of multiple critical dimensions.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
   forming a multi-level dielectric layer out of a substantially conformal dielectric layer through one or more isotropic etching processes of said substantially conformal dielectric layer, said multi-level dielectric layer having a plurality of regions covering a plurality of mandrels, said plurality of regions of said multi-level dielectric layer having different thicknesses;
   etching said plurality of regions of said multi-level dielectric layer into spacers by applying a directional etching process, said spacers being formed next to sidewalls of said plurality of mandrels and having different widths corresponding to said different thicknesses of said plurality of regions of said multi-level dielectric layer;
   removing said plurality of mandrels in-between said spacers; and
   transferring bottom images of said spacers into one or more layers underneath said spacers.

2. The method of claim 1, wherein forming said multi-level dielectric layer comprises:
   forming said substantially conformal dielectric layer over said plurality of mandrels;
   covering a first portion of said substantially conformal dielectric layer with a mask directly on top thereof;
   etching rest of said substantially conformal dielectric layer, which is a second portion thereof and is not covered by said mask, in an etching process, thereby causing said second portion of said substantially conformal dielectric layer to have a thickness that is less than that of said first portion of said substantially conformal dielectric layer; and
   removing said mask.

3. The method of claim 2, wherein said substantially conformal dielectric layer comprises at least a first and a second successively deposited layers of dielectric materials, and wherein etching said second portion of said substantially conformal dielectric layer comprises removing said second layer of dielectric material that is not covered by said mask to expose said first layer of dielectric material underneath thereof.

4. The method of claim 3, wherein said dielectric material of said second layer is different from said dielectric material of said first layer, and said removing of said second layer of dielectric material is performed through an etching process that is selective to said first layer of dielectric material.

5. The method of claim 2, after removing said mask which is a first mask, further comprising:
   forming a second mask covering a third portion of said substantially conformal dielectric layer;
   etching rest of said substantially conformal dielectric layer, which is a fourth portion thereof and is not covered by said second mask, in an etching process; and
   removing said second mask.

6. The method of claim 5, wherein said third portion of said substantially conformal dielectric layer is a portion of said first portion of said substantially conformal dielectric layer that is previously covered by said first mask, and wherein said etching of said fourth portion of said substantially conformal dielectric layer creates three different thicknesses in three different regions of said substantially conformal dielectric layer.

7. The method of claim 5, wherein said third portion of said substantially conformal dielectric layer is a combination of a section of said first portion and a section of said second portion of said substantially conformal dielectric layer, and wherein said etching of said fourth portion of said substantially conformal dielectric layer creates four different thicknesses in four different regions of said substantially conformal dielectric layer.

8. The method of claim 2, wherein said mask is a hard mask.

9. The method of claim 1, wherein within each of said plurality of regions of different thicknesses said multi-level dielectric layer is a substantially conformal dielectric layer.

10. The method of claim 1, wherein transferring bottom images of said spacers comprises applying a directional etching process to etch away portions of said one or more layers thereupon said spacers are formed by applying said spacers as a protection mask.

11. A method comprising:
   forming a substantially conformal dielectric layer over a plurality of mandrels, said substantially conformal dielectric layer having a plurality of regions covering said plurality of mandrels;
   transforming said substantially conformal dielectric layer into a multi-level dielectric layer through one or more isotropic etching processes to have different thicknesses in said plurality of regions;
   etching said plurality of regions of said multi-level dielectric layer into spacers, said spacers being adjacent to sidewalls of said plurality of mandrels and having different widths corresponding to said different thicknesses of said plurality of regions of said multi-level dielectric layer;
   removing said plurality of mandrels in-between said spacers; and
   transferring bottom images of said spacers into one or more layers underneath said spacers.

12. The method of claim 11, wherein transforming said substantially conformal dielectric layer into said multi-level dielectric layer comprises:
   covering a first portion of said substantially conformal dielectric layer with a mask;
   etching rest of said substantially conformal dielectric layer, which is a second portion thereof and is not covered by said mask, in an etching process, thereby causing said second portion of said substantially conformal dielectric layer to have a thickness that is less than that of said first portion of said substantially conformal dielectric layer.

13. The method of claim 12, wherein said substantially conformal dielectric layer comprises at least a first and a second successively deposited layers of different dielectric materials, and wherein etching said second portion of said substantially conformal dielectric layer comprises removing said second layer of dielectric material that is not covered by said mask selectively to said first layer of dielectric material underneath thereof.

14. The method of claim 12, wherein said mask is a first mask, further comprising:
   forming a second mask covering a third portion of said substantially conformal dielectric layer; and
   etching rest of said substantially conformal dielectric layer, which is a fourth portion thereof and is not covered by said second mask, in an etching process.

15. The method of claim 14, wherein said third portion of said substantially conformal dielectric layer is a combination of a section of said first portion and a section of said second portion of said substantially conformal dielectric layer, and wherein said etching of said fourth portion of said substantially conformal dielectric layer creates four different thicknesses in four different regions of said substantially conformal dielectric layer.

16. The method of claim 14, wherein said first and second masks are either hard masks, soft masks, or a combination of hard mask and soft mask.

17. A method comprising:
   forming a first dielectric layer over a plurality of mandrels, said first dielectric layer being a silicon-nitride layer or a silicon-oxide layer and having a plurality of regions covering said plurality of mandrels;
   transforming said first dielectric layer into a second dielectric layer having different thicknesses in said plurality of regions;
   etching said plurality of regions of said second dielectric layer into spacers, said spacers being adjacent to sidewalls of said plurality of mandrels and having different widths corresponding to said different thicknesses of said plurality of regions of said second dielectric layer;
   removing said plurality of mandrels in-between said spacers; and
   transferring bottom images of said spacers into one or more layers underneath said spacers.

18. The method of claim 17, wherein transforming said first dielectric layer into said second dielectric layer comprises:
   covering a first portion of said first dielectric layer with a mask;
   etching rest of said first dielectric layer, which is a second portion thereof and is not covered by said mask, in an etching process, thereby causing said second portion of said first dielectric layer to have a thickness that is less than that of said first portion of said first dielectric layer.

19. The method of claim 18, wherein said mask is a first mask, further comprising:
   forming a second mask covering a third portion of said first dielectric layer; and
   etching rest of said first dielectric layer, which is a fourth portion thereof and is not covered by said second mask, in an etching process to create difference in thickness in different regions of said second dielectric layer.

20. The method of claim 17, wherein said first dielectric layer is a substantially conformal dielectric layer and wherein said second dielectric layer is a multi-level dielectric layer having multiple levels of thicknesses in different regions.

* * * * *